United States Patent
Leif

(10) Patent No.: US 9,759,760 B2
(45) Date of Patent: Sep. 12, 2017

(54) METHOD AND DEVICE FOR TESTING SOLENOID VALVES

(75) Inventor: Thyssen Leif, Sydals (DK)

(73) Assignee: Mahle International GmbH (DE)

(*) Notice: Subject to any disclaimer, the term of this patent is extended or adjusted under 35 U.S.C. 154(b) by 902 days.

(21) Appl. No.: 13/552,361

(22) Filed: Jul. 18, 2012

(65) Prior Publication Data

US 2013/0027046 A1 Jan. 31, 2013

(30) Foreign Application Priority Data

Jul. 25, 2011 (EP) .................................... 11175141

(51) Int. Cl.
*G01R 31/327* (2006.01)
*G01R 31/06* (2006.01)
*G01R 31/28* (2006.01)
*G01R 31/02* (2006.01)

(52) U.S. Cl.
CPC ............ *G01R 31/06* (2013.01); *G01R 31/025* (2013.01); *G01R 31/2829* (2013.01)

(58) Field of Classification Search
CPC .............. G01R 31/327; G01R 31/3275; G01R 31/3278
USPC .................................................. 324/415–434
See application file for complete search history.

(56) References Cited

U.S. PATENT DOCUMENTS

| 3,727,626 | A | * | 4/1973 | Kanwisher et al. | ............ 137/88 |
| 5,153,522 | A | * | 10/1992 | Sano | .............................. 324/546 |
| 5,272,441 | A | * | 12/1993 | Wright et al. | ................ 324/546 |
| 5,548,210 | A | * | 8/1996 | Dittrich | .......................... 324/415 |
| 6,475,228 | B1 | * | 11/2002 | Mesaros et al. | .............. 606/202 |
| 6,917,203 | B1 | | 7/2005 | Perotti et al. | |
| 7,432,721 | B2 | * | 10/2008 | Rober | ........................... 324/522 |
| 7,705,561 | B2 | * | 4/2010 | Yano | ............................. 320/118 |
| 2010/0148755 | A1 | * | 6/2010 | Liu | ............................ 324/123 R |
| 2011/0089854 | A1 | * | 4/2011 | Yang et al. | .................... 315/291 |

FOREIGN PATENT DOCUMENTS

| JP | 4-196203 | 7/1992 |
| JP | 5-211105 | 8/1993 |

OTHER PUBLICATIONS

Advanced Information: Quad Low Side Switch (MC33293A Data Sheet) (Motorola 1996).*

* cited by examiner

*Primary Examiner* — Tung X Nguyen
*Assistant Examiner* — Robert P Alejnikov, Jr.
(74) *Attorney, Agent, or Firm* — Fishman Stewart PLLC

(57) ABSTRACT

A device for testing a solenoid valve includes: a voltage generator for applying a short pulse of voltage, which is not long enough to open the solenoid valve, to the windings of the solenoid valve; a current meter configured for measuring the current flowing through the windings of the solenoid valve; and an analysis device which is configured for analysing the current measured by the current meter for detecting a potential fault of the solenoid valve.

9 Claims, 5 Drawing Sheets

METHOD AND DEVICE FOR TESTING SOLENOID VALVES

BACKGROUND OF THE INVENTION

1. Field of the Invention

The present invention is directed to a method and a device for testing at least one solenoid valve.

2. Description of the Related Art

Self test functionality is an already known feature. The purpose of these functions is to give the end user as well as the production engineer an indication if one or more of the components in the system are faulty.

When it comes to mechanical solenoid valves the functionality is usually verified by opening the solenoid valve in the system. By using built in pressure sensors and temperature probes it is possible to monitor if the solenoid opens or not. This method tests (a) if the solenoid is connected correctly and there are no open or short circuits in either wiring, solenoids or electronics, and (b) if the correct valve actually opens if the solenoid is energized.

This known method for testing solenoid valves is time consuming and it is sometimes not desirable to pressurize the system in a self test by opening the valve as it may not be possible to depressurise the system again if the solenoid is faulty.

BRIEF SUMMARY OF THE INVENTION

It is an object of the present invention to provide an improved method and an improved device for testing solenoid valves.

A method of testing a solenoid valve according to the invention comprises the steps of applying a voltage to the windings of the solenoid for a short period of time, which is not long enough to open the valve, measuring the current flowing through the windings of the solenoid, and analysing the measured current in order to detect if a defect is present in the solenoid valve.

A device for testing a solenoid valve comprises a solenoid valve, a voltage generator for applying a short pulse of voltage, which is not long enough to open the solenoid valve, to the windings of the solenoid valve, a current meter, which is configured for measuring the current flowing through the windings of the solenoid valve, and an analysis device, which is configured for analysing the current measured by the current meter in order to detect a defect of the solenoid valve.

By testing a solenoid valve using a method and/or device according to the invention, the tested valve needs not to be opened for testing. Thus, the system is not pressurized for testing and in consequence there is no need to depressurise the system after the test. Therefore, and since the voltage is applied only for a very short time, the test can be performed very fast.

In an embodiment of the method the voltage is applied for less than 50 ms, preferably for less than 25 ms. Applying the voltage for less than 50 ms ensures that the valve is not opened, but the time for which the voltage is applied is long enough for analysing the current flowing through the windings of solenoid valve.

In one embodiment, the voltage is applied in the form of a square formed pulse. Applying the voltage in the form of a square pulse causes a waveform of the current which is very indicative of possible defects of the solenoid valve and which is easy to analyse.

One embodiment of the method includes detecting a disconnection if no current flowing through the windings is measured. Detecting that no current is flowing through the windings of the solenoid valve is an easy and reliable method for detecting a disconnection.

In one embodiment, the step of analysing the measured current includes analysing the waveform of the current over time. Analysing the waveform of the current flowing through the windings of the solenoid valve over time is a reliable method for identifying possible defects of the valve.

One embodiment of the method includes detecting a short circuit if the measured waveform is a square wave having a high amplitude, i.e., an amplitude which is bigger than a predetermined maximum value. A short circuit in the windings of the solenoid valve and/or the wires connected to the windings will cause a current signal with a high amplitude and a square waveform as no inductance is present in the electrical circuit. A square wave with a high amplitude is therefore a reliable indicator for a short circuit being present.

One embodiment of the method includes detecting that a mechanical pin of the valve is stuck in an open position but the valve is not activated if the waveform is similar to the expected waveform but the amplitude is below a first threshold. The threshold may be 10 to 15 percent below the expected maximum value.

One embodiment of the method includes detecting that a mechanical pin of the valve is stuck in a closed position if the waveform is similar to the expected waveform but the amplitude exceeds a second threshold. The threshold may be 10 to 15 percent above the expected maximum value.

Analysing the waveform of the current flowing through the windings of the solenoid valve over time is a reliable method for identifying a stuck mechanical pin in the valve.

DETAILED DESCRIPTION OF THE INVENTION

Figure 1:
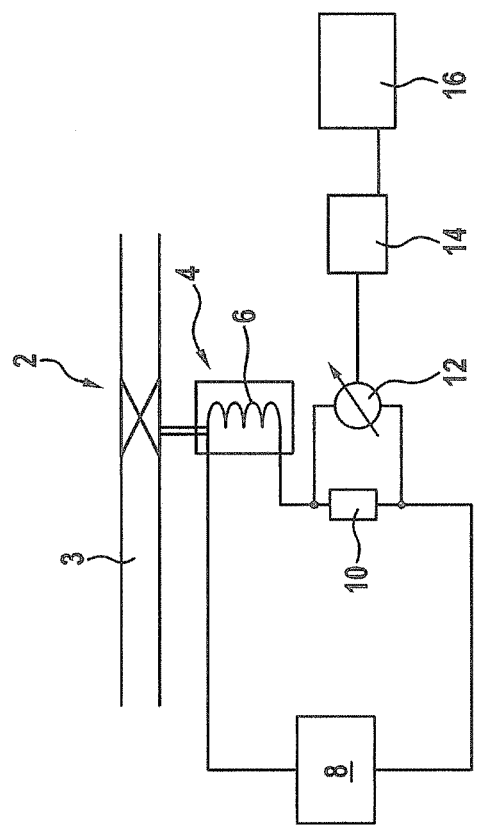
FIG. 1 shows a schematic diagram of a first embodiment of a device for testing a solenoid valve according to the invention.

FIG. 1 shows a schematic view of a first embodiment of device for testing a solenoid valve 2 arranged at a fluid conduit 3.

The solenoid valve 2 comprises a solenoid drive 4 with at least one winding 6. The solenoid drive 4 is configured to open the solenoid valve 2 when an electric current flows through said winding 6.

The test device further comprises a voltage generator 8, which is electrically connected to the winding 6 and configured to apply a short pulse of voltage, which is not long enough to open the solenoid valve 2, to the winding 6. At least one shunt 10 is arranged in the electrical connection between the voltage generator 8 and the winding 6. According to Ohm's law a voltage, which is proportional to the electrical current flowing through said shunt 10, is generated between the endings of the shunt 10. The generated voltage is measured by means of a voltage meter 12 electrically connected to the ends of the shunt 10.

The voltage meter 12 is electrically connected to an analogue-digital-converter 14, which is configured to convert the electrical voltage measured by the voltage meter 12 to digital data, which is supplied to an analysis device 16.

The analysis device 16 is configured to analyse the data provided by the analogue-digital-converter 14 in order to check the solenoid valve 2 and to detect possible faults. The analysis device 16 may be integrated with the voltage generator 8 or may be provided as separate device, as shown in FIG. 1.

FIGS. 2a-2e show five examples of current flowing through the winding 6 of the solenoid drive 4 as a function of time when a short pulse of voltage, which is not long enough to open the solenoid valve 2, is applied to the winding 6 by means of the voltage generator 8.

In the diagrams shown in FIGS. 2a-2e the horizontal axis (x-axis) represents the time and the vertical axis (y-axis) represents the current flowing through the winding 6, which is proportional to the voltage measured between the ends of the shunt 10.

Figure 2A:
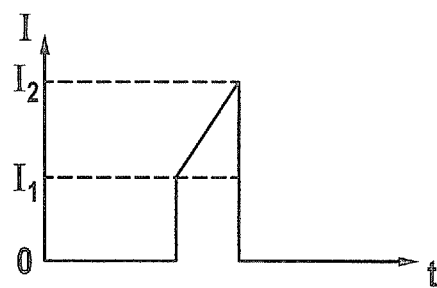
FIGS. 2a-2e show examples of detected waveforms corresponding to different conditions of the valve.

FIG. 2a shows the waveform of the current flowing through the winding 6 when the solenoid valve 2 is fine and no fault is detected.

In this case, the current first raises almost immediately from zero to a first value $I_1$ and then further with linear inclination to a maximum value $I_2$. The current then drops back to zero current almost immediately.

Figure 2B:
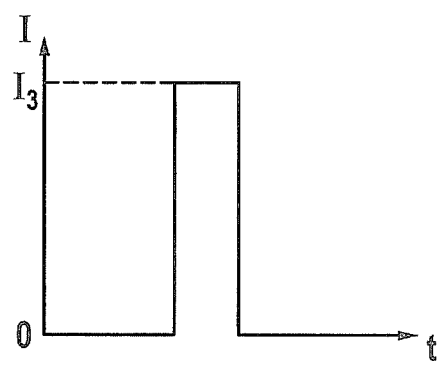

FIG. 2b shows the waveform of the current I flowing through the winding 6 over time when a short-circuit is present. As in this case the inductance of the winding 6 is not present in the circuit, the current I raises almost immediately to a maximum value $I_3$ and basically remains at this value before it decreases back to zero again.

Thus, if such a rectangular waveform of the current flowing through the winding 6 is detected, a short circuit in the winding 6 or the electric lines connected to the winding 6 is detected and a corresponding message will be output.

Figure 2C:
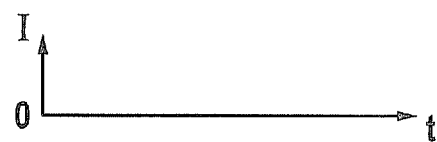

FIG. 2c shows the situation in which the winding 6 of the solenoid drive 4 is disconnected. In this case no current is flowing through the circuit at all.

Figure 2D:
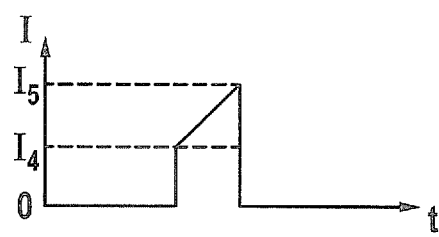

FIG. 2d shows the waveform of the current flowing through the winding 6 in a situation in which a mechanical pin of the valve 2 is stuck in an open position.

The waveform in this case is similar to the waveform of a correctly working valve, as it is shown in FIG. 2a, i.e. the current raises almost immediately to a first value $I_4$ and then further linearly to a maximum value $I_5$, before it drops back to zero current again.

However, in this case, the maximum value $I_5$ is approximately 10 to 15 percent below the maximum value $I_2$ reached in the first case (FIG. 2a), in which the valve 2 is operating correctly without any fault. Thus, in case the expected maximum value $I_2$ is not reached, a mechanical pin stuck in an open position is detected.

Figure 2E:
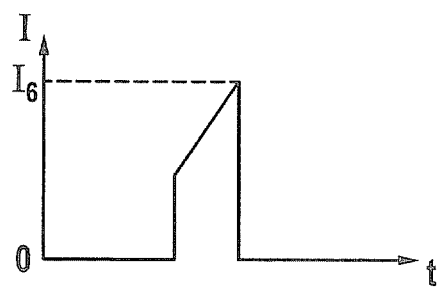

FIG. 2e shows the waveform of the current in a case in which the mechanical pin of the valve is stuck in a closed position. The waveform in this situation is similar to the waveforms shown in FIG. 2a (no fault) and FIG. 2d (stuck in open position), but the maximum value $I_6$ which is reached is 10 to 15 percent above the maximum value $I_2$, which is reached when no fault is present, as it is shown in FIG. 2a.

Thus, by analysing the waveform of the current flowing through the winding 6 of the solenoid drive 4, a couple of different faults of the solenoid valve 2 can be detected and distinguished from each other. This allows to check the solenoid valve 2 fast and reliably without the need of opening the solenoid valve 2 and pressurizing the system.

Figure 3:
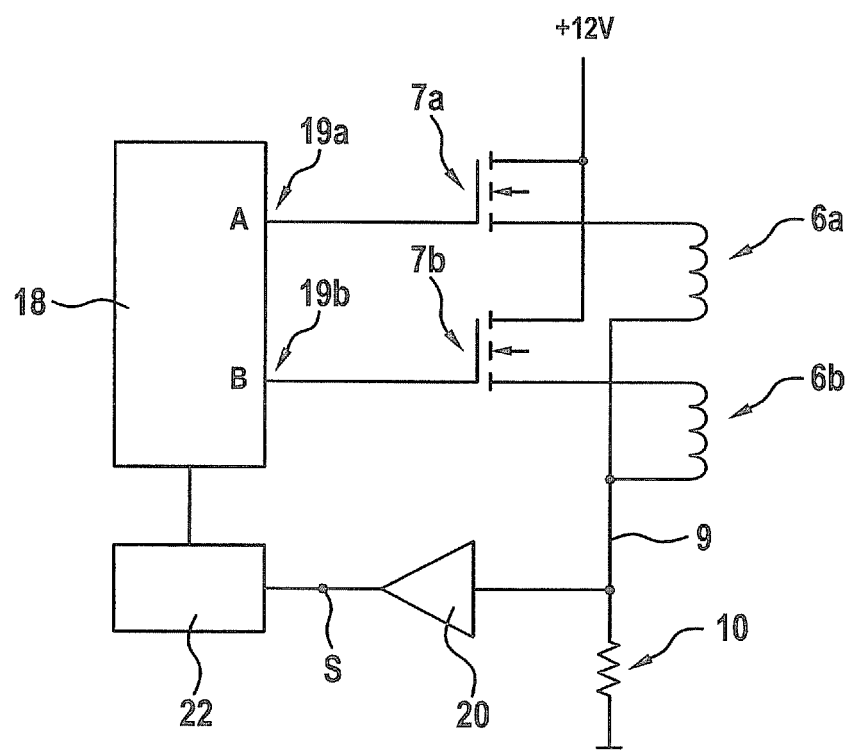
FIG. 3 shows a second embodiment of a device according to the invention.

FIG. 3 shows a schematic view of the test device according to a second embodiment, which allows to test two solenoid valves 2.

From the solenoid valves 2 to be tested and the respective solenoid drives 4 only the windings 6a, 6b are shown in FIG. 3.

A voltage may be selectively applied to each of the windings 6a, 6b by means of a control unit 18, which may be a microprocessor. The voltage is selectively output at terminals 19a, 19b of the control unit 18 and supplied to the windings 6a, 6b by respectively assigned transistors 7a, 7b so that the control unit 18 does not need to provide the full current flowing through the windings 6a, 6b.

A shunt 10 is located in a common ground line 9 of the windings 6a, 6b and the voltage which is generated between the ends of the shunt 10 according to Ohm's law is amplified by an amplifier 20 and input into an analogue-digital-converter 22, which is configured for converting the amplified voltage to digital data. The digital data is supplied to the control unit 18.

In the second embodiment shown in FIG. 3, the control unit 18, which may comprise at least one microprocessor, combines the functionality of the voltage generator 8 and the analysis device 16 of the first embodiment, which is shown in FIG. 1.

Thus, the control unit 18 analyses the digital data provided by the analogue-digital-converter 22 in order to detect possible faults of the solenoid valves 2 based on the waveforms caused by the different faults, as shown in FIGS. 2a-2e. Of course, the control unit 18 may comprise further output terminals in order to allow to actuate and check the windings 6a, 6b of additional solenoid valves 2.

FIG. 4 schematically shows exemplary waveforms generated at the points A, B and S of 3 as a function of time (x-axis).

Figure 4A:
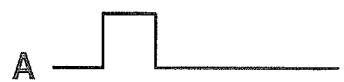
FIGS. 4a-4c show examples of waveforms generated by the device shown in FIG. 3 in operation.
Figure 4B:
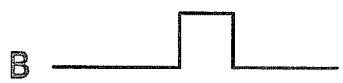

First, a rectangular formed voltage signal is applied to the winding 6a of the first solenoid valve (FIG. 4a). After the voltage applied to the first winding 6a has been switched off, a second rectangular voltage signal is applied to the second winding 6b (FIG. 4b).

Figure 4C:

If both windings 6a, 6b and the corresponding solenoid valves are fine and no fault is present, each of the voltage signals applied to the windings 6a, 6b will generate a signal having a waveform similar to the waveform shown in FIG. 2a (FIG. 4c).

Thus, a plurality of solenoid valves may be tested easily with a single test device. The invention provides an improved method and an improved device allowing to test the functionality of solenoid valves fast and easily without opening the valves and pressurizing the system.

What is claimed is:

1. A method for testing a solenoid valve, comprising:
    applying a voltage to a winding of the solenoid valve for a period of time which is not long enough to open the solenoid valve;
    obtaining a current waveform flowing through the winding that results from the applied voltage; and
    analysing both of a form and an amplitude of the current waveform to identify faults of the solenoid valve.

2. The method of claim 1, wherein the voltage is applied for less than 50 ms.

3. The method of claim 2, wherein the voltage is applied in the form of a square pulse.

4. The method of claim 2, wherein a disconnection is detected if the form of the current waveform indicates that no current is flowing through the winding.

5. The method of claim 2, wherein a mechanical pin of the solenoid valve being stuck in an open position is detected if the amplitude of the current waveform is below a first threshold.

6. The method of claim 2, wherein a mechanical pin of the solenoid valve being stuck in a closed position is detected if the amplitude of the current waveform exceeds a second threshold.

7. The method of claim 2, wherein the step of analysing includes analysing the form of the current waveform over time.

8. The method of claim 7, wherein a short circuit is detected if the amplitude of the current waveform is a square wave which exceeds a predetermined third threshold.

9. A device for testing a solenoid valve, comprising:
a voltage generator for applying a short pulse of voltage, which is not long enough to open the solenoid valve, to a winding of the solenoid valve;
a voltage meter configured for measuring a current waveform flowing through the winding of the solenoid valve; and
an analysis device configured for analysing both of a form and an amplitude of the current waveform to detect a fault of the solenoid valve;
wherein the current waveform is measured via components that include:
a shunt connected serially to the winding of the solenoid valve; and
the voltage meter configured to measure the current waveform via voltage caused by the current flowing through the shunt.

* * * * *